(12) United States Patent
Nakamoto

(10) Patent No.: US 8,896,158 B2
(45) Date of Patent: Nov. 25, 2014

(54) VARIABLE CAPACITANCE CIRCUIT

(75) Inventor: Hiroyuki Nakamoto, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 311 days.

(21) Appl. No.: 13/306,595

(22) Filed: Nov. 29, 2011

(65) Prior Publication Data

US 2012/0217822 A1 Aug. 30, 2012

(30) Foreign Application Priority Data

Feb. 24, 2011 (JP) ................................. 2011-037837

(51) Int. Cl.
*H02M 3/06* (2006.01)
*H03H 5/02* (2006.01)

(52) U.S. Cl.
CPC ...................................... *H03H 5/02* (2013.01)
USPC ................ 307/109; 307/82; 307/80; 307/39; 307/44; 307/86; 455/264; 455/255; 455/258; 455/260; 333/174; 333/185; 333/170

(58) Field of Classification Search
USPC .......... 307/109; 455/264, 255, 258, 259, 260, 455/262; 333/174, 185, 170–172
See application file for complete search history.

(56) References Cited

U.S. PATENT DOCUMENTS

| | | | |
|---|---|---|---|
| 8,183,959 B2* | 5/2012 | Katta | 333/174 |
| 8,212,420 B2* | 7/2012 | Okanobu | 307/109 |
| 2004/0092242 A1* | 5/2004 | Endo | 455/264 |
| 2005/0239415 A1 | 10/2005 | Sagae et al. | |
| 2010/0019582 A1 | 1/2010 | Okanobu | |

FOREIGN PATENT DOCUMENTS

| | | |
|---|---|---|
| JP | 10-93302 A | 4/1998 |
| JP | 2000-150779 A | 5/2000 |
| JP | 2005-318093 A | 11/2005 |
| JP | 2008-166877 A | 7/2008 |

\* cited by examiner

*Primary Examiner* — Rexford Barnie
*Assistant Examiner* — Jagdeep Dhillon
(74) *Attorney, Agent, or Firm* — Fujitsu Patent Center

(57) ABSTRACT

A variable capacitance circuit includes: a prescribed node, to which an alternate current signal with a reference potential as a center voltage is applied; a first capacitor connected to the prescribed node; a second capacitor connected between the first capacitor and the reference potential; a third capacitor and a transistor for controlling capacitance, provide between a first node between the second capacitor and the first capacitor, and the reference potential; and a bias circuit which applies a first bias voltage to a second node between the third capacitor and the transistor.

9 Claims, 10 Drawing Sheets

(1) G=AVD(SW:ON)

(2) G=AVS(SW:OFF)

(1) G=AVD(SW:ON)

(2) G=AVS(SW:OFF)

(2) G=AVS(SW:OFF)

(1) G=AVD(SW:ON)

VARIABLE CAPACITANCE CIRCUIT

CROSS-REFERENCE TO RELATED APPLICATION

This application is based upon and claims the benefit of priority of the prior Japanese Patent Application No. 2011-037837, filed on Feb. 24, 2011, the entire contents of which are incorporated herein by reference.

FIELD

Embodiments discussed herein relate to a variable capacitance circuit.

BACKGROUND

A variable capacitance circuit has a plurality of circuits each having capacitor and switch, and, by controlling the number of the switches to be ON, variably controls the capacitance value. Such a variable capacitance circuit is used, when there is a need for variably setting a capacitance value of a certain node according to various conditions.

For example, at an output terminal of a power amplifier used for a mobile phone or the like, an impedance-matching circuit is equipped. An impedance-matching circuit has an inductor and a capacitor. For enabling a fine adjustment of impedance of an impedance-matching circuit, possible options are to enable a variable control of the inductance value of the inductor, or to enable a variable control of the capacitance value of the capacitor. In general, a variable capacitance circuit for variably controlling the capacitance value is used. A variable capacitance circuit is also used when there is a need for variably setting the capacitance value for various situations other than a power amplifier.

Such a variable capacitance circuit has circuits in parallel, each of which has capacitor and MOS transistor between an output terminal of a power amplifier and the ground, and, by turning the MOS transistors ON, increases the capacitance of the output terminal.

Descriptions relating to a variable capacitance circuit are in Japanese patent laid-open publications No. 2008-166877 and No. 2000-150779.

However, in the power amplifier in the above examples, high-power signals are delivered to the output terminals. For example, when impedance of an output of a mobile phone is temporarily mismatched, there will be a case that the output power momentarily exceeds 30 dBm. This power means, if converted into a voltage amplitude of an AC (alternate current) signal with 50Ω matching, an amplitude of plus/minus 10V with 0V as the center voltage.

Hence, there is a concern for the variable capacitance circuit connected to the output terminal of the power amplifier such that an exceptionally high-power voltage applied to the capacitor element and thus the capacitor is broken. Therefore, a circuit configuration with considering withstanding voltage of the capacitor element is desired.

The above AC signal occurring at the output terminal with a large amplitude with 0V as the center voltage has a voltage exceeding the power-supply voltage, and has, on the other hand, a large minus voltage. Hence, PN junction of a drain of MOS transistor within the variable capacitance circuit becomes conductive, which causes distortion of the waveform of the output signal.

SUMMARY

A variable capacitance circuit includes: a prescribed node, to which an alternate current signal with a reference potential as a center voltage is applied; a first capacitor connected to the prescribed node; a second capacitor connected between the first capacitor and the reference potential; a third capacitor and a transistor for controlling a capacitance, provide between a first node between the second capacitor and the first capacitor, and the reference potential; and a bias circuit which applies a first bias voltage to a second node between the third capacitor and the transistor.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
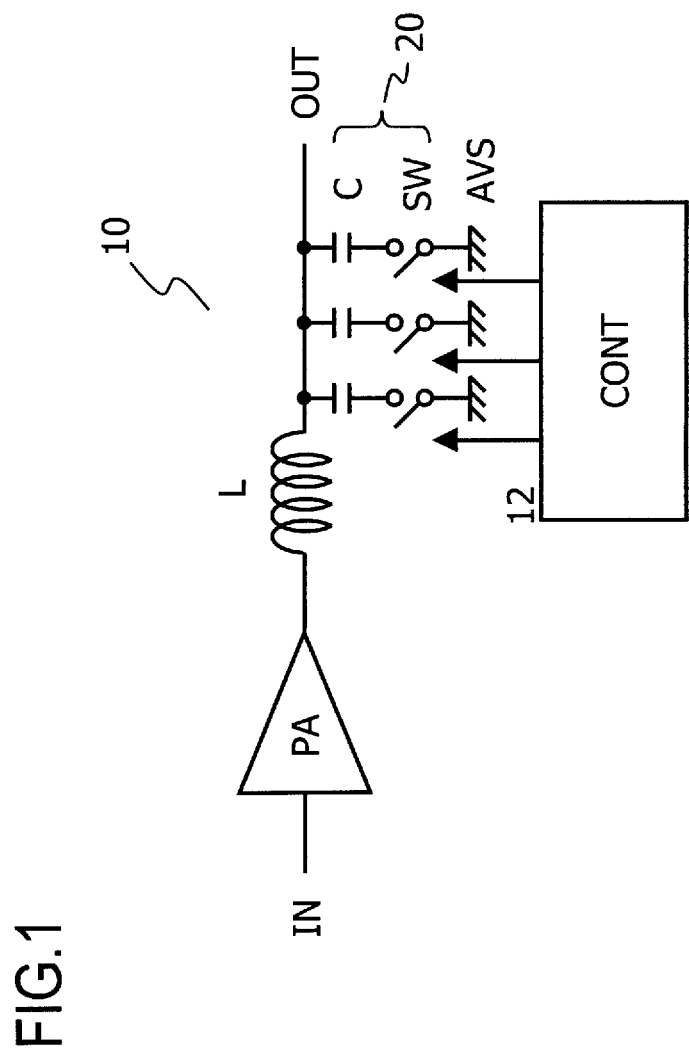
FIG. 1 is a drawing for illustrating a power amplifier to which a variable capacitance circuit of an embodiment is applied.

FIG. 1 is a drawing for illustrating a power amplifier to which a variable capacitance circuit of the present embodiment is applied. In FIG. 1, there are illustrated a power amplifier PA, which amplifies input signal IN and generates high-power output signal OUT, and an impedance-matching circuit 10, equipped at an output OUT of the power amplifier PA. The impedance-matching circuit 10 includes an inductor L, a variable capacitance circuit 20, and a control circuit 12 for controlling the capacitance value of the variable capacitance circuit 20.

In the variable capacitance circuit 20 illustrated in FIG. 1, between the output terminal OUT of the power amplifier and the ground AVS as a reference potential, a plurality of circuits each having capacitor C and switch SW are equipped in parallel.

When a switch SW is made to be conductive by a control signal from the control circuit 12, the capacitance value of the capacitor C connected to the switch is added to the capacitance value of the output terminal OUT. When a switch SW is non-conductive, the lower electrode of the capacitor C connected to the ground AVS becomes "floating", and the capacitance value thereof is not added to the capacitance value of the output terminal OUT. The control circuit 12 generates the control signal according to a prescribed monitoring amount and makes necessary number of the switches SW conductive, thus controlling the capacitance value of the variable capacitance circuit 20 to be at the optimal values. The switches SW are constituted by, for example, MOS transistors.

The power amplifier PA amplifies an input signal IN with a small amplitude to generated a high-power output signal. This output signal is an AC signal of a large amplitude with a reference potential such as the ground AVS as the center voltage. Hence, a capacitor equipped between the output terminal and the ground is applied with a high voltage. Therefore, it is desired to prevent the capacitor within the variable capacitance circuit from being broken even under an application of a high voltage.

Figure 2A:
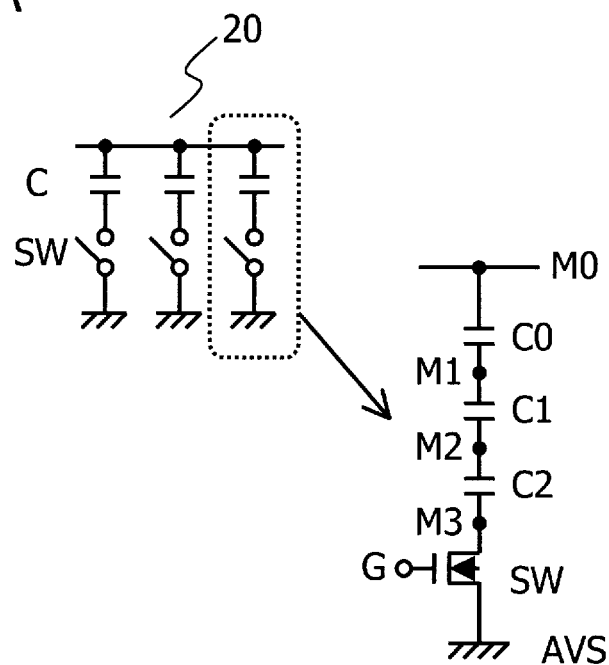
FIGS. 2A and 2B are drawings for illustrating examples of the variable capacitance circuit and operations thereof.
Figure 2B:
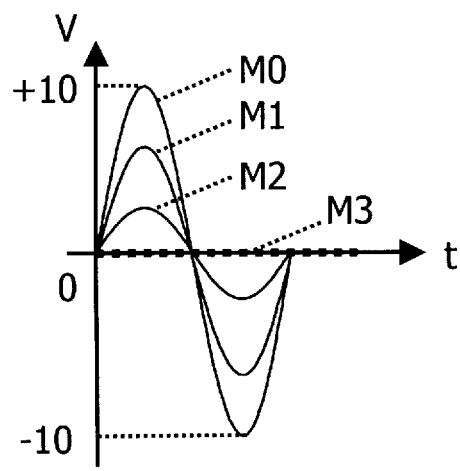

FIGS. 2A and 2B illustrate examples of a variable capacitance circuit and operations thereof. In FIG. 2A, there is illustrated a circuit example which has sets of the capacitor C and the switch SW within the variable capacitance circuit 20. Since an AC signal with a large amplitude is applied to the output terminal of the power amplifier PA or the like illustrated in FIG. 1, the circuit is configured so that the capacitors C are prevented from being broken.

That is, in the variable capacitance circuit of FIG. 2A, a plurality of capacitors C0, C1, and C2 and the switch SW constituted by N-channel MOS transistor are serially connected between the prescribed node M0, such as an output terminal, to which the AC signal of the power amplifier or the like is applied, and the ground AVS. Then, to the gate of the transistor SW, a control signal G from the control circuit is provided.

In the example of FIG. 1, since the withstanding voltage of the capacitor is approximately equal to the power-supply voltage (AVD=3.3V), for ensuring the endurance against the amplitude voltage of plus/minus 10V of the AC signal at the prescribed node M0, serially connected 3-stage capacitors C0, C1, and C2 are configured. Here, the capacitance values of these capacitors are assumed to be equal. Thereby, the differential voltage applied between the electrodes of one capacitor is made to be approximately 3.3V, which is no greater than the withstanding voltage. As illustrated, nodes (the terminals) of the capacitor are referred to, from the top to the bottom, as M0, M1, M2, and M3, and the gate of the transistor SW is referred to as G.

Incidentally, there are supposed to be equipped elements at the nodes M0-M2 for forming leak paths to the ground, which are omitted here. These leak paths are provided so as to avoid plasma charge particles, used for patterning wirings in a wiring pattern process of a semiconductor production, being accumulated in the wire, potential thereof rising to cause a large potential difference, and thus elements having thin oxide-films being broken.

FIG. 2B illustrates the operational waveforms of the nodes M0-M3 at the times of the switch SW being ON and OFF. The node M0 corresponds to the output terminal of the power amplifier, and has a waveform of the AC signal with the amplitude of plus/minus 10V with 0V as a reference potential at the center. When the gate G is at the power-supply level AVD of H level (G=AVD), that is, the transistor SW as a switch is ON, the potential at the node M3 is equal to the ground potential. Then, the potential difference between the node M0 and the ground is divided into three, and the potentials of the other nodes M1, M2 appear to be, as illustrated, AC signals with amplitudes smaller than that of the node M0 with the reference potential 0V as the center voltages.

On the other hand, when the gate G is at the ground level AVS of L level (G=AVS), that is, the switch SW is OFF, the node M3 has high impedance. Hence, idealistically each of the nodes M0-M3 has the same AC signal waveform, and the capacitors C0-C2 are ignorable from the node M0, thus combined capacitance being zero.

However, realistically, if a minus voltage of a large amplitude is provided to the node M3, which is the drain terminal of the transistor SW, the PN junction between an N-type drain region of the transistor SW and a P-type well region which is the back gate thereof becomes conductive, and thus electrical charges are injected into the node M3 from the ground.

Figure 3:
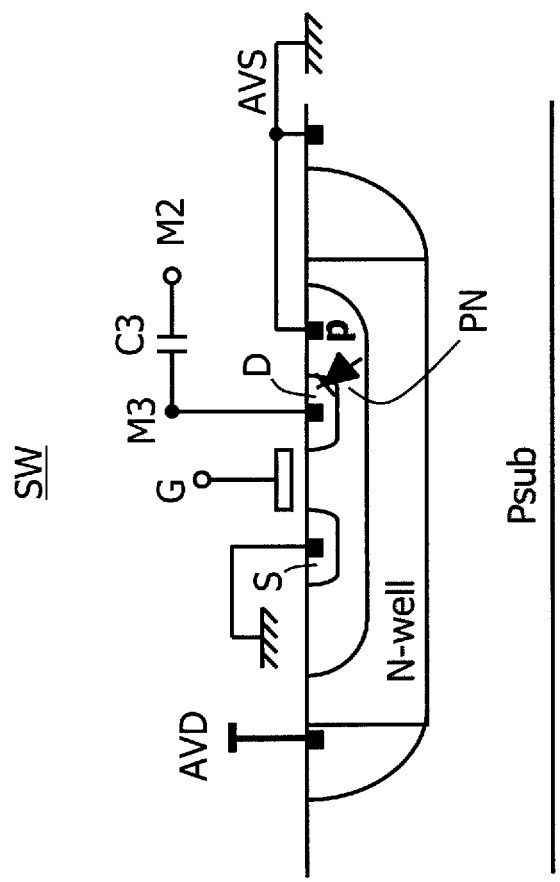
FIG. 3 is a drawing for illustrating the structure of a transistor SW.

FIG. 3 illustrates a structural example of the transistor SW. As illustrated in FIG. 3, a N-channel MOS transistor is constituted by a N-type well region N-well formed within the P-type substrate Psub, a P-type well region P-well formed within the N-well, a N-type source and drain S, D formed within the P-well and a gate electrode. Then, if a minus voltage with a large amplitude is provided to the node M3 when the transistor SW being OFF, the PN junction constituted by the P-well region P-well, which is the back gate fixed at the ground potential AVS, and the drain D (n+ diffusion), which is connected with the node M3, exceeds the threshold voltage thereof to be forward biased. As a result, a phenomenon occurs, such that the PN junction becomes conductive, the electrical charges are injected from the ground AVS into the node M3, and thus the potential at the node M3 does not fall to ideal −10V. That is, the waveform at the node M3 appears to be as illustrated in a dashed line in FIG. 2B(2).

As such, the waveform at the node M3 is distorted at the minus (lower) side. This means that, the node M3 has a capacitive load, into which electrical charges are injected from the ground, and an ideal operation (the waveform Ideal in FIG. 2B, (2)), at the time of the transistor SW being OFF, is not obtained. It is also meant that, if a large minus voltage signal is input momentarily, as with an orthogonal frequency division multiplexing (OFDM) signal, an ideal operation for making the switch SW OFF cannot be operated, which causes the waveform at the node M0 to be distorted, and, for example, the linearity of the output signal of the power amplifier is deteriorated.

Figure 2B:
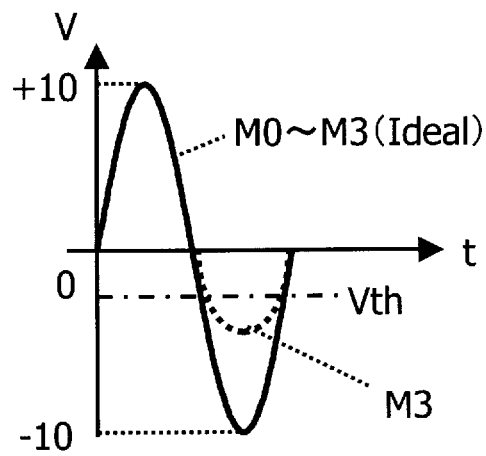
Figure 4A:
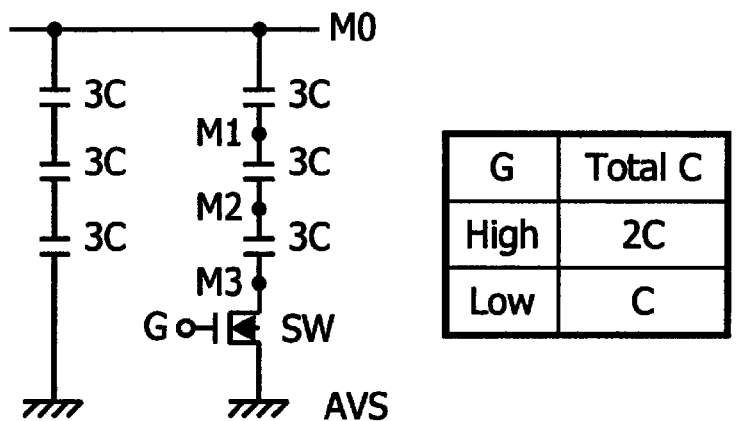
FIGS. 4A and 4B are drawings for illustrating operational simulations on the variable capacitance circuit of FIG. 2.
Figure 4B:
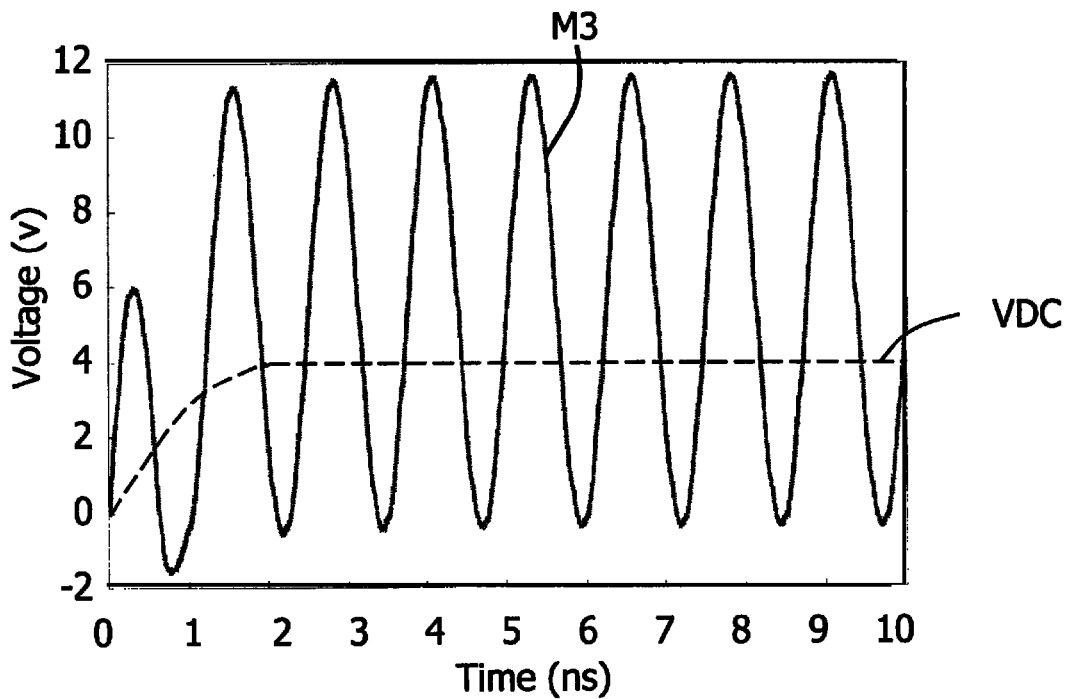

FIGS. 4A and 4B illustrate operational simulation of the variable capacitance circuit of FIG. 2. The simulation model includes, as illustrated in FIG. 4A, between the node M0, to which an AC signal with the ground as the center voltage is applied, and the ground, a left-side circuit having serially connected three capacitors of the capacitance values 3C, and a right-side circuit in which three capacitors of the capacitance values 3C and a N-MOS transistor SW are serially connected. When the control signal applied to the gate G is H level, the transistor SW is turned to be ON, and the circuits on the both sides are in a state such as being connected in parallel between the node M0 and the ground, thus having the combined capacitance value of 2C. On the other hand, when the control signal to the gate G is L level, the transistor SW is turned to be OFF, and the left-side circuit alone is in a state such as being connected between the node M0 and the ground, thus having the half combined capacitance value, C. For example, it is to be understood that, if the capacitance value C is set such that C=2.5 pF, the combined capacitance value is variably controlled to be 5.0 pF as the transistor SW being ON, and to be 2.5 pF as the transistor SW being OFF.

The simulation result illustrated in FIG. 4B indicates voltage change at the node M3 at the time when the control signal to the gate G is made to be L level thus turning the transistor SW to be OFF, and the AC signal is applied at time 0 ns, of which the voltage oscillates with the ground (0V) as the center voltage. When the transistor switch SW is OFF, immediately after the time 0 ns, the potential at the node M3 being in floating state is supposed to increase or decrease with 0V as the center voltage following the AC signal at the node M0. Then, when the node M3 has a minus potential between the time 0 ns and 1 ns, the PN junction between a P-type well, which is the back gate of the transistor, and an n+ diffusion of the drain is forward biased, and exceeds the threshold voltage so as to be ON. At this time, electrical charges are injected from the back gate into the drain, and the potential thereof does not falls to an ideal minus potential, −10V. Therefore, the waveform of the potential at the node M3 is distorted with a small amplitude on the minus side and a large amplitude on the plus side, which is not an ideal waveform with 0V as the center voltage.

According to the simulation result of FIG. 4B, the maximum value of the potential at the node M3 appears to be rather higher than +10V at the node M0. The reason for that is because a current from the back gate to the drain which is input into the node M3 causes a DC potential VDC at the node M3 to gradually increase from the time 0 ns, and oscillates at the node M3 up and down around the increased DC potential VDC. Hence, it appears that, according to the simulation result, the waveform at the node M3 follows the waveform at the node M0 in the steady state (8-10 ns).

However, the absolute potential thereof exceeds +10V. If the drain connected with the node M0 has over +10V, the PN junction between the P-type well region and the drain D in FIG. 3 is practically reverse biased, and a voltage exceeding the breakdown voltage (approximately 10V) is applied thereto, thus causing a large current to pass from the drain D to the P-type well region, then towards the ground. Thereby, the actual waveform at the node M3 is not such a waveform as in FIG. 4B oscillating up and down on the plus side. Incidentally, this breakdown model is not implemented in the simulation model.

As such, when the transistor SW is OFF, the waveform at the node M3 is not an ideal waveform which follows the node M0, but is distorted on the minus side, and further the waveform is greatly differ from the ideal waveform due to the breakdown of the PN junction.

As for a multi-carrier radio communication such as OFDM communication in radio communication, since a plurality of sub carriers, of which frequencies are in orthogonal relation to one another, are multiplexed, multiplexed signals will have high crest-factor. Hence, in such a communication, at the output terminal of the power amplifier, the potential varies momentarily raising to the plus side and falling to the minus side. Therefore, it is demanded that a variable capacitance circuit is adaptable to a case that such the waveform with high crest-factor signal is applied to the node M0.

It is desired to configure the variable capacitance circuit of the present embodiment, so that the capacitors within the variable capacitance circuit are maintained below the withstanding voltage even when at the above node M0 being applied with an AC signal having a potential equal to or more than the power-supply voltage (for example, 3.3 V) or a minus potential equal to or less than the ground. It is particularly desired that, when the transistor SW as a switch is OFF, the capacitance load is kept small so that the waveform at each node is prevented from distortion and the node M0 is unaffected.

The First Embodiment

Figure 5:
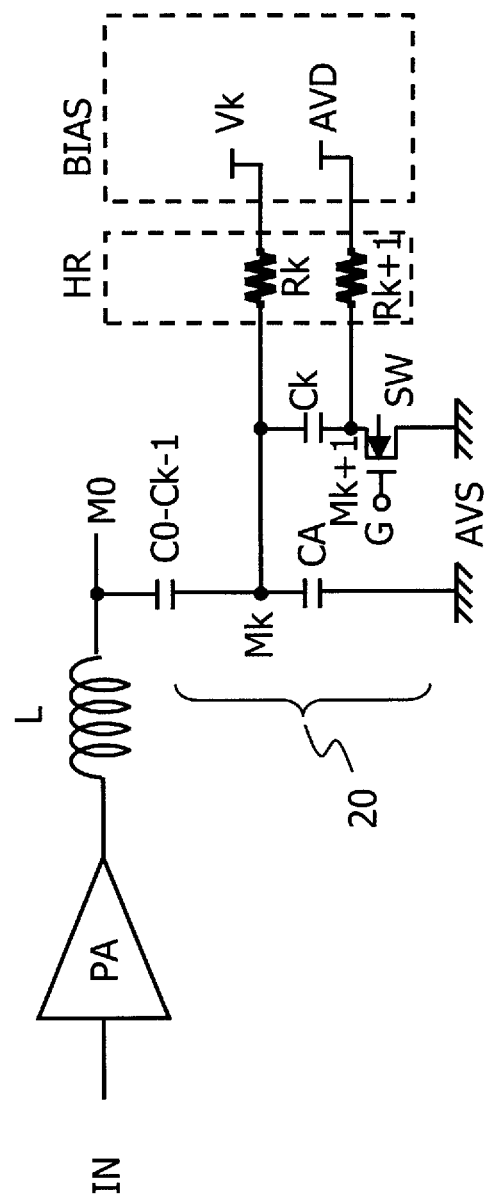
FIG. 5 is a drawing for illustrating the variable capacitance circuit of the first embodiment.

FIG. 5 illustrates the variable capacitance circuit of the first embodiment. The variable capacitance circuit 20 illustrated in FIG. 5 is equipped, for example, between a prescribed node M0, which is an output terminal of a power amplifier PA, and the ground AVS, which is the reference potential. The output terminal of the power amplifier is an example of a prescribed node. An alternate current (AC) signal with the ground as the reference potential at the center is applied to the prescribed node M0. Then, the variable capacitance circuit 20 includes first capacitors C0-Ck−1 connected with the prescribed node M0, a second capacitor CA provided between the first capacitor and the reference potential AVS, a third capacitor Ck provided between a first node Mk, between the second capacitor CA and the first capacitors C0-Ck−1, and the reference potential AVS, and a transistor SW for controlling the capacitance.

The first capacitors C0-Ck−1 are constituted by one capacitor or a plurality of serially connected capacitors, in which the number of the capacitors are determined so that the voltages between the electrodes of the capacitors are kept equal to or less than the withstanding voltage corresponding to the amplitude of the AC signal at the prescribed node M0. When the amplitude of the AC signal at the prescribed node M0 is plus/minus 10V and the withstanding voltage of the capacitor is approximately 3.3V, k=2 is selected, and the configuration between the prescribed node M0 and the ground is such that three capacitors, the first capacitors C0, C1 and the second capacitor CA are serially connected. Depending upon the capacitance value of the second capacitor CA, k=3 may be selected, and, in such a case, four-capacitor configuration is adapted. There may be a case such that the amplitude of the AC signal is small and thus k=1, and, in that case, the first capacitor is constituted by only one capacitor C0.

The variable capacitance circuit 20 includes a bias circuit BIAS which applies a first bias voltage AVD to a second node Mk+1 between the third capacitor Ck and the transistor SW. This first bias voltage is such a plus potential that at least the PN junction between the drain and the back gate of the transistor SW does not become conductive in the forward direction, which preferably is the power-supply voltage AVD (for example, 3.3V).

The bias circuit BIAS applies a second bias voltage Vk to the first node Mk, as well. This second bias voltage Vk may be, depending on the circuit condition, either the ground potential, or a potential between the ground and the first bias voltage AVD.

The first and second bias voltages AVD, Vk are respectively applied, via the high-resistance resistors Rk+1, Rk, to the nodes Mk+1, Mk. The high-resistance resistors Rk+1, Rk, as being inserted between the intermediate node of the capacitance and the bias circuit, function as the leak paths at the nodes Mk+1, Mk (paths for electrical charges to escape), which possibly occur in the above described wiring pattern process during a semiconductor production. Further, since the resistance values of Rk+1, Rk are high, the cut-off frequency of the low pass filter having a CR circuit looking from the node M0 to each bias voltage AVD, Vk is set to be low, and there is not a case that leakage of the high frequency components of the AC signal at the node M0 occurs.

In the above variable capacitance circuit 20, the distortion of waveform at the node Mk+1 is suppressed or avoided as follows. For example, between the prescribed node M0 and the ground AVS, the first capacitors C0-Ck−1 and the second capacitor CA are configured to be serially connected whether the transistor SW is ON or OFF. Hence, when the transistor SW is ON, the AC signal waveform at the node Mk, upon the AC signal with a large amplitude being applied to the prescribed node M0, is such a waveform as obtained by dividing the potential of the AC signal at the prescribed node M0 and the ground potential by the first capacitors C0-Ck−1 and the second capacitor CA, and the amplitude thereof is smaller than the amplitude of the AC signal at the node M0.

Also, when the transistor SW is OFF, the potential at the second node Mk+1 follows the amplitude at the first node Mk. However, since the first plus bias voltage AVD is applied to the second node Mk+1, the potential at the second node Mk+1 has as small amplitude as the first node Mk, with the first bias voltage AVD as the center voltage, that is, a potential such as AVD+Mk.

As a result, even when the minus potential of a large amplitude is applied to the node M0, the potential at the drain of the transistor SW connected with the second node Mk+1 does not fall to as low as the potential for making the PN junction of the back gate conductive in a forward direction, and the potential of the PN junction is suppressed below the threshold voltage Vth thereof, thus suppressing or avoiding the conduction of PN junction.

Further, if the second bias voltage Vk is at the ground potential, the AC signal at the first node Mk has a small amplitude signal with 0V as the center voltage. On the other hand, when the second bias voltage Vk is at a plus potential between the ground and the first bias voltage AVD, the AC signal at the first node Mk has a small amplitude signal with the second plus bias voltage Vk as the center voltage. In either case, it is preferred that the second bias voltage Vk is selected so that the voltage between the first and the second nodes Mk, Mk+1 remains equal to or less than the withstanding voltage of the third capacitor Ck.

As such, the variable capacitance circuit 20 of FIG. 5 has a configuration as follows. First, a second capacitor CA connected to the ground is provided so that the plurality of capacitors are certainly connected between the node M0 and the ground AVS, even when the transistor SW as a switch is in OFF state. Secondly, appropriate bias potentials Vk, AVD are respectively provided via the high-resistance resistors to the first node Mk between the first and the second capacitors and to the second node Mk+1 on the drain side of the switch transistor SW.

In the following, variable capacitance circuits in accordance with two embodiments will be explained, based on the basic configuration of the variable capacitance circuit of FIG. 5.

The Second Embodiment

Figure 6:
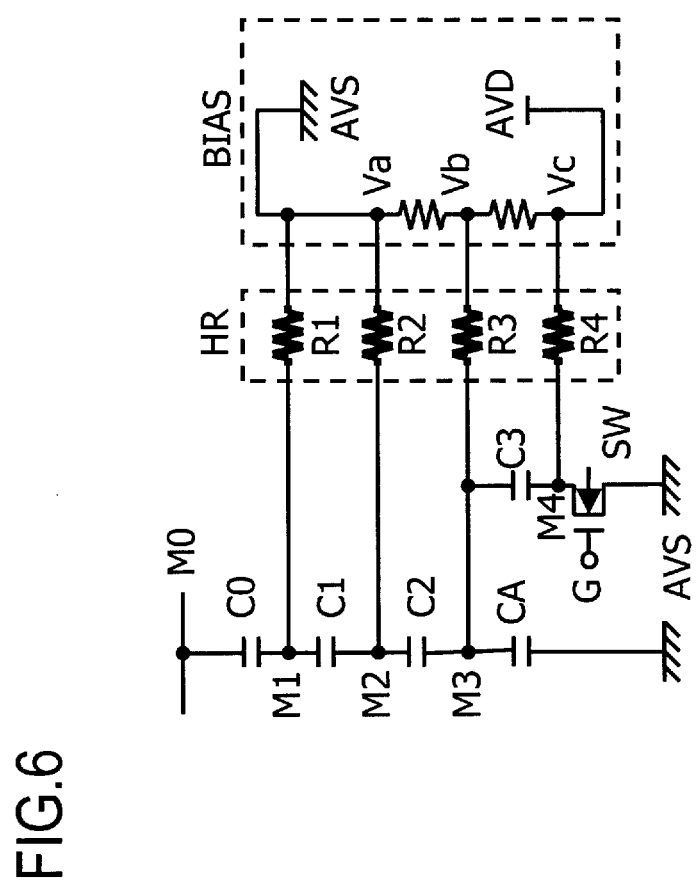
FIG. 6 is a drawing for illustrating the variable capacitance circuit of the second embodiment.

FIG. 6 illustrates the variable capacitance circuit of the second embodiment. In the second embodiment, the first capacitors C0-Ck−1 of the first embodiment in FIG. 5 is constituted by three capacitors C0, C1, and C2, and, to the first node Mk (M3), a bias voltage Vb between the power supply AVD and the ground AVS is applied via a high-resistance resistor R3. Further, the nodes M1, M2 are connected to the ground potential AVS via high-resistance resistors R1, R2. These high-resistance resistors R1, R2, and R3 constitute, as well as the above-described leak paths, a low pass filter with a low cut-off frequency. Also, the node M4 is, as with an example of FIG. 5, connected to the bias voltage of the power supply AVD via a high-resistance resistor R4.

That is, in the second embodiment, the capacitors C0-C2 are serially connected between the prescribed node M0 and the ground AVS, the switching transistor SW and the capacitor C3 serially are connected in series between the node M3 and the ground, and the capacitor CA is provided between the node M3 and the ground. Also, a bias potential of the bias circuit BIAS is provided to the intermediate nodes M1, M2, and M3 of the capacitors C0-CA and the drain terminal M4 of the transistor SW, respectively via the high-resistance resistors R1-R4.

The high resistances are preferably equal to or more than about 100 kΩ. These resistors are desired to have a large resistance values to some extent so as to reduce a loss caused by the high-frequency signal at the prescribed node M0 leaking through the capacitors C0-C2 and the high-resistance resistors R1-R4.

Figure 7:
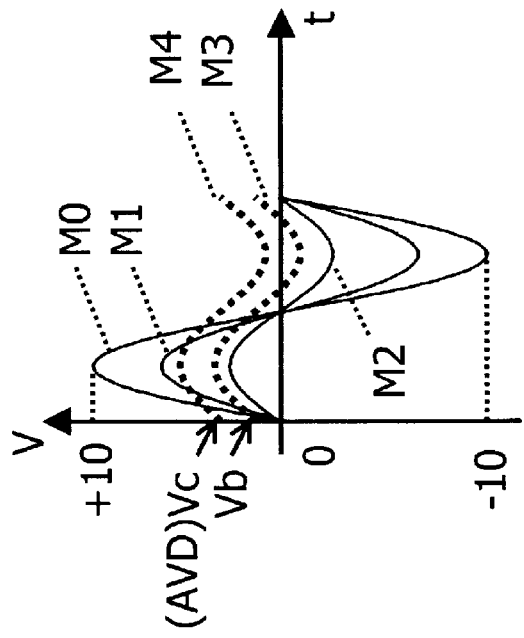
FIGS. 7(1) and 7(2) are operational-waveform diagrams of the variable capacitance circuit of the second embodiment.
Figure 7:
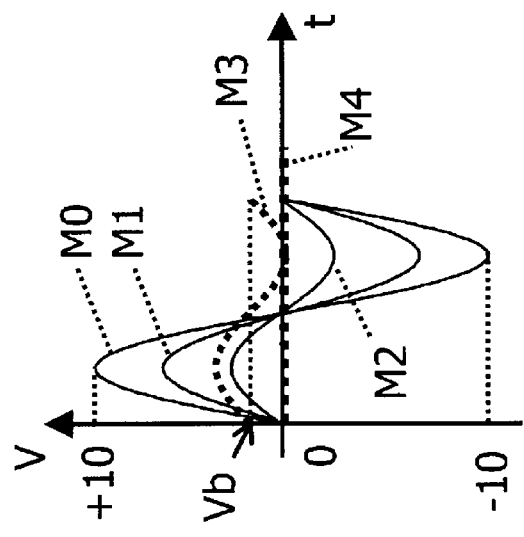

FIG. 7 illustrates an operational waveform of the variable capacitance circuit of the second embodiment. FIG. 7 illustrates a waveform at each node at the time when the switch SW turns ON and OFF, while the AC signal oscillating plus/minus 10V with the prescribed node M0 as the center voltage is applied.

Whichever the switch is ON or OFF, the capacitors C0-C2, and CA are serially connected from the prescribed node M0 to the ground. Thereby, the AC waveform at each of the nodes M0-M3 is such a waveform as obtained by dividing the AC waveform at the prescribed node M0. And, the DC potentials at the nodes M1-M3 are respectively fixed at the potentials provided by the bias circuit, that is, Va, Va, and Vb. Hence, the waveforms at the nodes M1, M2, and M3 are as illustrated, such as to have AC amplitudes obtained by dividing voltage between the prescribed node M0 and the ground into four with to the bias voltages Va, Va, and Vb as the reference voltage.

Since the bias voltage Va is the ground 0V, the nodes M1, M2 have AC waveforms with 0V as the center voltage. Since the bias voltage Vb is a potential between the power-supply AVD (=3.3V) and the ground AVS, the node M3 has an AC waveform with the bias voltage Vb as the center voltage. Here, since the capacitor C3 is connected or disconnected to the ground according to the transistor SW being ON or OFF, the dividing ratio differs according thereto, and thus the amplitude of the node M3 differs accordingly. When the transistor SW is ON, the amplitude at the noted M3 becomes smaller.

Next, the waveform of the node M4 at the time of the switching transistor SW being OFF will be explained. When the transistor turns to be OFF, the node M4 becomes high-impedance in terms of alternate current, and is fixed to be the bias voltage Vc, the power-supply potential, via the high-resistance resistor R4 in terms of direct current. Thus, as illustrated in FIG. 7(2), the potential of the node M4 oscillates in the same amplitudes as the node M3 with the DC potential of the bias voltage Vc as the center voltage.

In configurations of FIG. 2 and FIG. 3, since capacitor CA of the present embodiment does not exist, the waveform at the node M3 is nearly identical to that of the node M0 upon the switching transistor SW being OFF, and, thereby, a large minus signal is provided to the drain terminal of the transistor. This causes the PN junction of the drain region to be conductive and a leakage current therefrom.

However, in this embodiment, since a fixed capacitance CA is provided, which is connected to the ground even when the transistor SW is in OFF state, the potential at the node M3 has a small amplitude obtained by dividing the voltage between the node M0 and the ground into four. Hence, the waveform of the node M4 coupled via the capacitor C3 has a similar small amplitude, as well.

Further, since the DC potential at the node M4 is shifted up to the bias voltage Vc (the power-supply voltage) by the high-resistance resistor R4, the node M4 does not have a minus potential, as illustrated by a dashed line in FIG. 7(2), and it is enabled to maintain the PN junction between the P-type well region Pwell of the back gate and the N-type drain region of the transistor SW to be always reverse biased. The bias voltage Vc and the capacitance values of the capacitors CA, C3, and the like are selected, so that at least the potential of the node M4 does not exceed the threshold voltage Vth of the above described PN junction.

Also, the high-resistance resistors R1-R4, being connected to the ground via the resistor of the bias circuit BIAS, have roles of the leak paths connected to the nodes M1-M4 between the capacitances.

Next, an operation of the potential of the node M4 at the time of the switching transistor SW being ON will be explained. At this time, the node M4 becomes the ground potential, and a parallel capacitance of the capacitors CA and C3 becomes a capacitor at the lowest part. All the capacitors of the variable capacitance circuit becomes serially connected four capacitors in total, which are a combined capacitor of the capacitors CA and C3, and the capacitors C0, C1, and C2. Then, considering that the DC potentials at the nodes M2 and M4 are at the ground, the DC potential Vb at the node M3 is selected, so that the voltages to be applied to the capacitors C1, C2, C3, and CA do not exceed the withstanding voltage. That is, since the potential obtained by adding the bias voltage and the AC amplitude at each of the nodes M1, M2, M3, and M4 is applied to each node, the bias voltage Vb is preset so that the voltage difference between the nodes does not exceed the withstanding voltage of each capacitor (for example, approximately the power-supply voltage 3.3V).

The Third Embodiment

Figure 8:
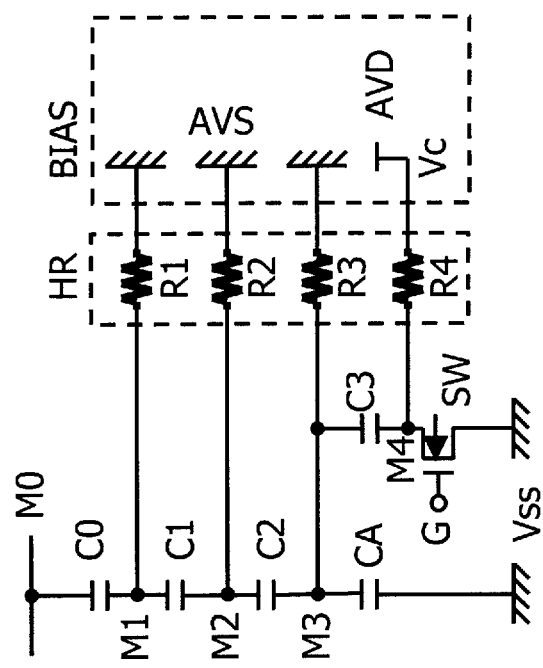
FIG. 8 is a drawing for illustrating the variable capacitance circuit of the third embodiment.
Figure 9:
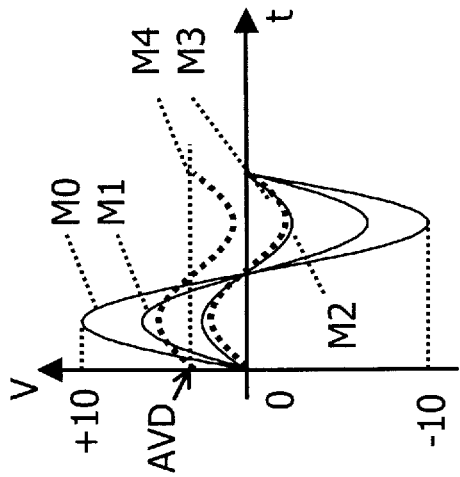
FIGS. 9(1) and 9(2) are operational-waveform diagrams of the variable capacitance circuit of the third embodiment.
Figure 9:
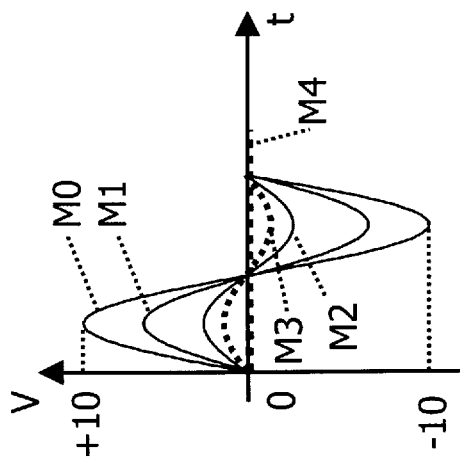

FIG. 8 illustrates the variable capacitance circuit of the third embodiment. Also, FIG. 9 illustrates an operational waveform of the variable capacitance circuit of the third embodiment. Unlike the variable capacitance circuit in FIG. 6, the node M3 is connected via the high-resistance resistor R3 to the ground AVS. The other configuration is the same as FIG. 6.

As illustrated in FIG. 9, the node M3 has a potential with an AC amplitude with the ground 0V as the center voltage. Hence, the DC bias voltage at the node M3 can be at the ground AVS, when a condition is satisfied such that the voltage difference between the nodes M3 and M4 is kept under the withstanding voltage of the capacitor C3, for example, when the amplitude of the AC signal applied to the prescribed node M0 is low, or the AC amplitude at the node M3 divided by the capacitors is low, or the bias voltage Vc at the node M4 is set to be lower.

That is, in an example of FIG. 8, the power-supply potential AVD is provided as the bias voltage only to the node M4, thus raising the DC potential at the node M4 so as to keep the potential thereat not at minus, and the DC potential at other nodes M1-M3 are fixed at the ground AVS via the high-resistance resistors R1-R3.

When the switching transistor SW is ON, since all the DC potentials at the nodes M1-M4 are at the ground potential and equal to one another, the voltages between the electrodes of the capacitors C0-C3, and CA depend on the AC amplitudes between the electrodes. In this case, in the embodiment of FIG. 8, since the capacitors C0-C3, and CA are configured to be vertically stacked considering the maximum amplitude of the voltages between the electrodes of the capacitors, there is no concern for breaking the capacitors due to the voltage between the electrodes exceeding the withstanding voltage of the capacitor.

On the other hand, when the switch transistor SW is OFF, the difference between the DC potentials at the nodes M3 and M4, that is, the DC potential difference between the electrodes of the capacitor C3 is equal to the power-supply potential AVD. Since the AC signal at the node M4 follows the amplitude at the node M3, the difference between the AC amplitudes at the both nodes M3 and M4 is zero. Consequently, since only the power-supply voltage AVD is applied to a portion between the terminals of the capacitor C3, it is enabled in this configuration to ensure that the withstanding voltage of the capacitor C3 is not exceeded.

Specific Embodiment

Figure 10A:
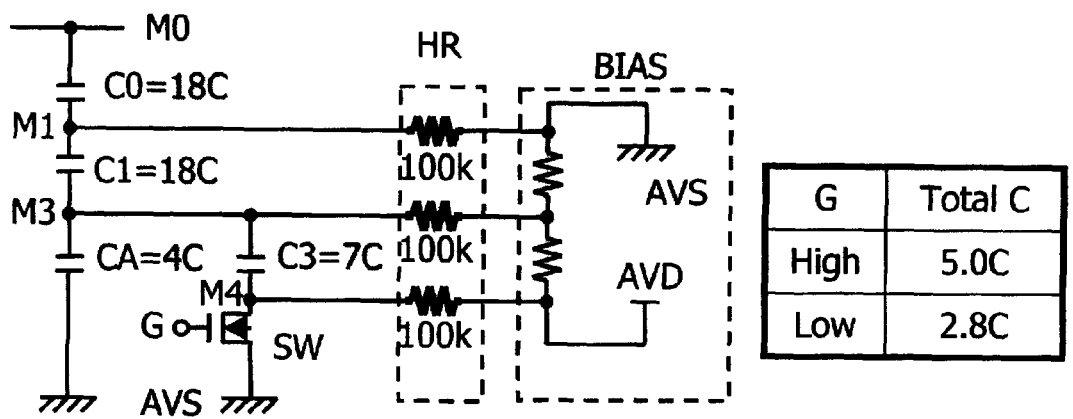
FIGS. 10A and 10B are drawings for illustrating the variable capacitance circuit in a practical example and a simulation result thereof.
Figure 10B:
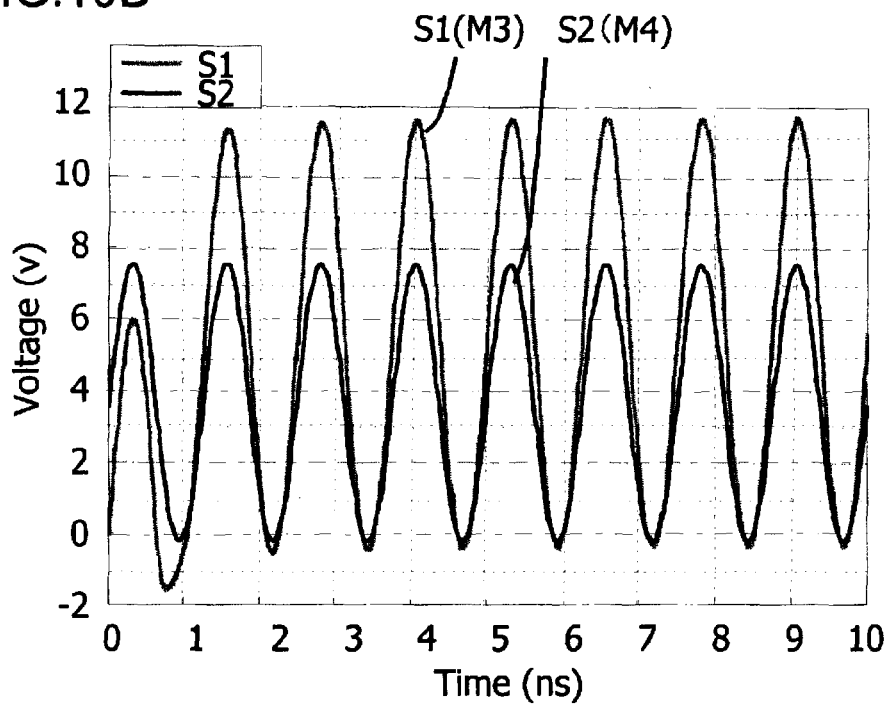

FIGS. 10A and 10B illustrate a variable capacitance circuit in specific embodiment and a simulation result. The capacitors in a circuit example of FIG. 10A are set such that C0=C1=18C, CA=4C, C3=7C, and the high-resistance resistors are set such that R1=R2=R4=100 kΩ. The combined capacitance value of the variable capacitance circuit at this time is approximately 5.0C as the switch being ON, and approximately 2.8C as the switch being OFF. That is, by setting C=1 pF, similarly to FIG. 4, the combined capacitance value at the prescribed node M0 can vary to be 5.0 pF when switching ON, or to be 2.8 pF when switching OFF.

FIG. 10B illustrates a waveform S2 of the node M4 when the switch being OFF in the circuit of FIG. 10A, and a waveform 51 of the node M3 at the time of the switch being OFF in the circuit of FIG. 4.

The AC amplitude at the node M4, at the time of the switch being OFF, follows the waveform at the node M3 obtained by dividing the amplitude at the node M0 by a fixed capacitance given under CA=4C in FIG. 10A. Hence, as illustrated by the simulation waveform S2, since the amplitude becomes small and the DC potential at the node M4 is provided with the power supply potential AVD, the PN junction between the back gate and the drain of the switching transistor SW does not become reverse biased, and thus an operation of a stable capacitor without distortion is possible. Also, since the node M4 does not change over 10V even transiently, a breakdown of the above PN junction in reverse direction does not occur.

As illustrated in FIG. 10, as for the capacitance value used for the variable capacitance circuit of the present embodiment, if the ratio of the capacitors C0, C1, and C3 to the fixed capacitor CA connected to the ground is made to be large, that is, the capacitance values of the capacitors C0, C1, and C3 is set to be larger than CA, the variability width of the combined capacitance value when the switching transistor SW is turned ON and OFF becomes to be widened. The reason for this is because the capacitor C3 is relatively larger than CA, the capacitance values CA+C3 and CA varies widely by the switching transistor SW being ON and OFF, and, additionally, the capacitors CA, C3 are serially connected to the capacitors C0, C1, which directly relates to the combined capacitance.

Although depending on the variable range or the capacitance value, which the variable capacitance circuit targets, it is generally preferred to set the capacitance values of the combined capacitor of C0 and C1 and the capacitor C3, with respect to the capacitor CA, to be doubled. In an example of FIG. 10, for CA=4, the combined capacitor of C0 and C1 being "9" and C3=7, which are set doubled. By increasing this ratio, wider variability range is obtained. Here, since the potential difference applied to the capacitors has a limitation of the withstanding voltage, it is considered that the realistic limitation of the setting is approximately ten times.

As explained above, in accordance with the variable capacitance circuit of the present embodiment, even when the AC signal of a relatively large amplitude is applied to the prescribed node M0, at which the capacitance is variably set, it does not occur that the drain terminal of the switching transistor SW becomes to minus potential, and that the voltage at the PN junction between the back gate and the drain region of the transistor exceeds the forward-direction threshold voltage. Therefore, even if a signal of a large amplitude is applied to the prescribed node M0, distortion of the waveform of the AC signal at M0 is suppressed or avoided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has been described in detail, it should be understood that the various changes, substitutions, and alterations could be made hereto without departing from the spirit and scope of the invention.

What is claimed is:

1. A variable capacitance circuit comprising:
a first node, to which an alternate current signal with a reference potential as a center voltage is applied;
a first capacitor having a first electrode connected to the first node and a second electrode connected to a second node which is different from the first node;
a second capacitor having a first electrode connected to the second node, and a second electrode connected to a reference potential terminal to which the reference potential is applied;
a third capacitor having a first electrode connected to the second node, and a second electrode connected to a third node which is different from the first node and the second node;
a transistor for controlling a capacitance, having a drain connected to the third node, a source connected to the reference potential terminal, and a gate to which a capacitance control signal is applied; and
a bias circuit which applies a first bias voltage to the third node.

2. The variable capacitance circuit according to claim 1, wherein
the first bias voltage is applied to the third node via a high-resistance resistor.

3. The variable capacitance circuit according to claim 1, wherein
the bias circuit provides the second node with the reference potential via a high-resistance resistor.

4. The variable capacitance circuit according to claim 1, wherein
the bias circuit provides the second node with a second bias voltage having a potential between the first bias voltage and the reference potential via a high-resistance resistor.

5. The variable capacitance circuit according to claim 1, wherein
the first capacitor includes a plurality of capacitors being serially connected, and
connection nodes of the plurality of capacitors of the first capacitor are connected, via high-resistance resistors, to a third bias voltage having the reference potential or a potential between the reference potential and the first bias voltage.

6. The variable capacitance circuit according to claim 5, wherein
capacitance values and the number of capacitors of the plurality of capacitors of the first capacitor are determined so that a voltage applied between electrodes of each of the plurality of capacitors of the first capacitor does not exceed a withstanding voltage of the plurality of capacitors, corresponding to the alternate current signal.

7. The variable capacitance circuit according to claim 1, wherein
the first bias voltage is such a potential that a PN junction between a back gate and a drain of the transistor does not become conductive when the transistor is OFF.

8. The variable capacitance circuit according to claim 4, wherein
the second bias voltage is such a potential that a voltage applied to capacitors at the both sides of the second node does not exceed a withstanding voltage of the capacitor.

9. The variable capacitance circuit according to claim 1, wherein
a combined capacitance value of the first, second, and third capacitor at the time of the capacitance control signal making the transistor conductive, is larger than the combined capacitance value at the time of the transistor being non-conductive.

* * * * *